United States Patent [19]

Kerr et al.

[11] Patent Number: 4,481,283
[45] Date of Patent: Nov. 6, 1984

[54] METHOD OF MANUFACTURING AN INTEGRATED CAPACITOR AND DEVICE OBTAINED BY THIS METHOD

[75] Inventors: George Kerr, St Sebastien sur Loire; Yves Méheust, Caen, both of France

[73] Assignee: U.S. Philips Corporation, New York, N.Y.

[21] Appl. No.: 479,426

[22] Filed: Mar. 28, 1983

[30] Foreign Application Priority Data

Apr. 30, 1982 [FR] France ................. 82 07535

[51] Int. Cl.³ .............................................. G03C 5/00
[52] U.S. Cl. .................................... 430/319; 430/314; 430/317; 357/51; 204/58; 29/570
[58] Field of Search ............. 430/314, 316, 317, 318, 430/319; 204/15, 56 R; 29/570, 592 E; 357/51

[56] References Cited

U.S. PATENT DOCUMENTS

| | | | |
|---|---|---|---|
| 3,739,239 | 6/1973 | Kerr | 357/51 |
| 3,839,164 | 10/1974 | Hurst | 204/385 |
| 3,864,817 | 2/1975 | Lapham, Jr. et al. | 29/577 |

FOREIGN PATENT DOCUMENTS

| | | | |
|---|---|---|---|
| 1920684 | 4/1969 | Fed. Rep. of Germany | |
| 54-158884 | 12/1979 | Japan | 430/314 |
| 907666 | 10/1962 | United Kingdom | 204/56 R |

OTHER PUBLICATIONS

Alcorn et al., NASA Tech. Briefs, Spring 1981, p. 104.

Primary Examiner—John E. Kittle
Assistant Examiner—José G. Dees
Attorney, Agent, or Firm—Jack E. Haken; James J. Cannon, Jr.

[57] ABSTRACT

A method of manufacturing integrated capacitors in a semiconductor body coated with a multilayer wiring network constituted by two patterns which are separated by insulating layers, in which method on a first insulating layer is deposited a metal layer from which a dense layer is formed by anodic oxidation, which layer is then subjected to a photo-etching treatment in order to form a dielectric of a capacitor, whose plates consist of parts of a second conductor pattern.

4 Claims, 3 Drawing Figures

METHOD OF MANUFACTURING AN INTEGRATED CAPACITOR AND DEVICE OBTAINED BY THIS METHOD

BACKGROUND OF THE INVENTION

1. Field of the Invention

The present invention relates to a method of manufacturing a semiconductor device having a semiconductor body which at a surface is provided with circuit elements and a multilayer wiring structure, in which the surface of the semiconductor body is coated with a first layer of insulating material on which there is formed from a metal layer deposited on the insulating material a first conductor pattern which contacts the semiconductor body at the area of contact holes in the first layer of insulating material and comprises at least one plate of a capacitor, after which a second conductor pattern is applied, which comprises a second plate of the capacitor and is separated therefrom by a dielectric obtained by anodic oxidation from the metal layer deposited on the first layer of insulating material.

The invention also relates to the device obtained by this method.

2. Description of the Prior Art

For the manufacture of capacitors in semiconductor devices for electronic applications, the thin-film technique is preferably used, the capacitors manufactured according to this technique having a larger capacity per unit surface area and having considerably lower parasitic resistances than the capacities of the diffused junctions that can also be used. Further the capacity of the thin-film capacitors is not dependent upon the applied voltage, as such is the case with the semiconductor junctions.

The insulating material used in these capacitors as a dielectric is mostly silicon oxide ($SiO_2$), because this oxide is formed during most of the methods for manufacturing devices from silicon substrates. However, this oxide has a low permittivity.

Since it is difficult to obtain this oxide in a very small thickness due to the risk of the occurrence of defects in the insulation, endeavors have been made to replace this dielectric by other materials of higher permittivity, especially by silicon nitride, both alone and together with silicon oxide, and more recently by aluminum oxide or aluminum oxide together with a layer of the said silicon oxide.

The known methods of obtaining homogenous and dense thin layers of these dielectrics generally require additional often complicated or very accurate treatments which require expensive measures to be taken. This is the case as to the layers of silicon oxide or of silicon nitride. This is the reason why there is generally an increasing tendency to use anodic oxidation for forming an oxide layer from the surface of an already deposited metal layer, a suitable voltage then being applied between the said metal surface to be oxidized and an electrode immersed in an electrolyte.

This solution is of special importance when the manufacture of so-called "MOM" (Metal—Oxide—Metal) capacitors is concerned because the dielectric layer of the capacitor can be formed in the first deposited metal layer.

Such a method is known from the French Patent Specification No. 2,138,339.

A choice can then be made not only with respect to the nature of the metals used, but also with respect to the composition of the electrolyte used for the anodization. It appears that during anodization of an aluminum layer given solutions used as the electrolyte, which, for example, contain oxalic acid and glycol ethylene, lead to a porous aluminum oxide layer. This phenomenon is often very unfavorable because aluminum is one of the metals which are most frequently used for the manufacture of contacts in semiconductor devices for electronic applications (transistors or integrated circuits) and for the manufacture of integrated capacitors; in these circumstances, the aluminum can diffuse into the porous aluminum oxide, which involves the risk of short circuits.

In order to mitigate this disadvantage, a protective layer is often applied consisting of a metal which prevents this diffusion, for example, nickel, which is deposited on either side of an aluminum oxide layer, but this method, which then comprises additional steps, thus becomes more complicated and more expensive.

On the other hand, it is known that, taking into account the density of the active or passive elements to be manufactured in an electronic microcircuit, the electrical connections between the various elements require an extensive network of contacts and interconnections, which for reasons of accomodation can be provided only in the form of juxtaposed layers separated by insulating layers (multilayer structure).

SUMMARY OF THE INVENTION

The invention has for its object to provide a method of manufacturing of MOM capacitors to be integrated in a multilayer structure, in particular with two wiring levels, by simple and reproducible operations which are compatible with the simultaneous manufacture of other elements of the conductor patterns and of the electrical connections or vias between these patterns.

The invention further has for its object to manufacture capacitors, the dielectric of which is a metal oxide with a high permittivity and in which the nature of the metal plates is also suitable for the manufacture of the electrical connections.

The invention is based on the formation of an oxide by anodization of a metal having a good electrical conductivity, which is immersed in a suitable electrolytic solution and is subjected to the effect of an external voltage.

A method according to the invention is therefore characterized in that, after the first layer of insulating material has been provided with contact windows, the metal layer is deposited on the whole surface of the semiconductor body and is converted over a part of its thickness by anodic oxidation into a second insulating layer of metal oxide, after which the double layer of metal and metal oxide is patterned photolithographically and the assembly is then coated with a third layer of insulating material, which at the area of the second plate of the capacitor and of connections between the two conductor patterns is provided with apertures, the metal oxide formed further being removed at the area of the connections, after which a layer of conductive material is applied from which the second conductor pattern is formed photolithographically which at the area of the connections contacts the first conductor pattern and which comprises the second plate of the capacitor, which is separated from the first plate by a part of the layer of metal oxide which is grown by anodic oxidation and serves as a dielectric.

This method has many advantages. In the first place, the fact that the second insulating layer has a high density, renders it possible to improve the characteristics of the capacitor manufactured and to eliminate the risk of the occurence of leakage currents. On the other hand, all the steps required for the use of the method are carried out at a low temperature and consequently do not influence the physical and electrical properties of the diffused or implanted circuit elements constituting the active or passive elements of the structure.

The main advantage, however, resides in the fact that the method according to the invention renders it possible to manufacture capacitors in a multilayer structure without increasing the number of operations because the plates of the capacitors are obtained simultaneously with each of the conductor patterns by photo-etching of the common metal layers.

Preferably, the metal layers which are deposited on the surface of the semiconductor body and constitute the first conductor pattern as well as the plates of the capacitors are made of aluminum, while the dense insulating layer is made of aluminum oxide.

It should be noted that various methods are already known of manufacturing MOM capacitors which are formed at the surface of semiconductor bodies from a dielectric layer which is obtained by anodic oxidation of a first subjacent metal layer, the dielectric layer itself being covered with a second metal layer. A capacitor of this type is described, for example, in the German Offenlegungsschrift No. 1,920,684. The capacitor described therein is provided with a dense aluminum oxide layer which is enclosed between two aluminum plates; however, like in other known methods, the method used greatly differs from that which is the subject matter of the present invention. According to the description in the aforementioned specification, the manufacture of the capacitor is in fact not related to the manufacture of a wiring network in a multilayer structure on the surface of the semiconductor body, which considerably simplifies the use of the method described, while on the other hand the multilayer structure nowadays is the only technique which is compatible with the increasingly complicated character of the novel integrated circuits.

Otherwise, according to the same specification, the dielectric layer is obtained by local anodic oxidation of the subjacent metal layer and the etching of the two plates of the capacitor is carried out after the said dielectric layer has been formed.

On the contrary, according to the present invention, the anodic oxidation as far as the insulating layer is carried out over the whole surface of the first metal layer and immediately after this oxidation treatment the insulating layer and the subjacent metal layer are etched so that a plate for the capacitor and a first conductor pattern are formed, after which the vias and the second conductor pattern are formed.

The present invention also relates to a semiconductor device provided with passive and active elements which is manufactured by means of a method according to the invention.

BRIEF DESCRIPTION OF THE DRAWINGS

In order that the invention may be readily carried out, it will now be described more fully with reference to the accompanying drawing, in which.

Figure 1:
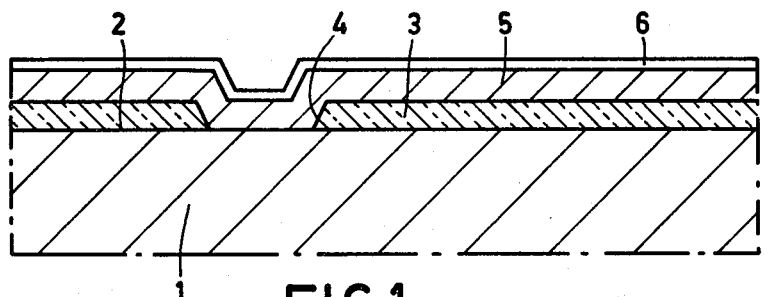
FIGS. 1 to 3 show diagrammatically and in sectional elevation various stages of the manufacture of a semiconductor device comprising a MOM capacitor obtained by the use of the method according to the invention.

It should be noted that in the Figures the dimensions are enlarged considerably and disproportionately for the sake of clarity of the drawing.

Figure 2:
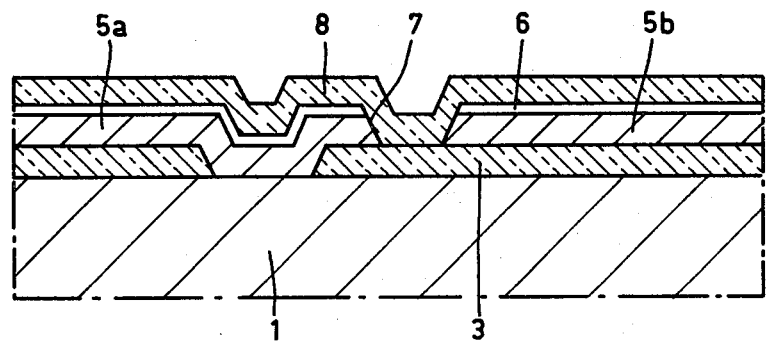
Figure 3:
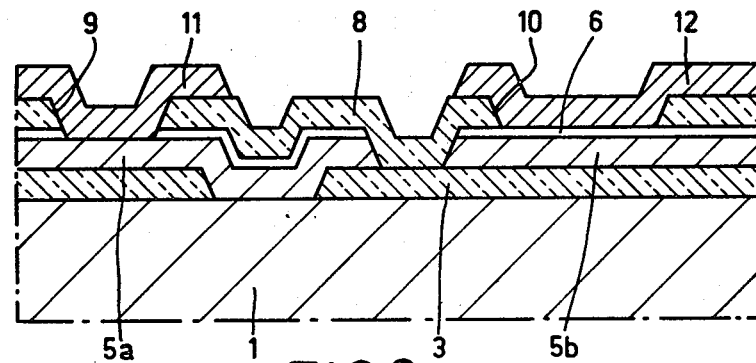

In the embodiment shown in FIGS. 1 to 3, the starting material is a semiconductor wafer 1 in which active and passive elements (not shown in the Figures) are formed. On the surface 2 of the said wafer is deposited a first insulating layer 3 of, for example, silicon oxide, in which the apertures 4 are provided, which are required for contacting the active or passive elements.

The surface of the insulating layer 3 and the apertures 4 are covered with an aluminum layer constituting the first metal layer 5 which at its surface is converted by anodic oxidation into a layer 6 of dense aluminum oxide which covers entirely said layer 5 (FIG. 1).

The aluminum oxide layer 6 is formed in an aqueous solution of tartaric acid of 30 g/l with a pH=1.8 at a voltage depending upon the desired thickness. The ratio between the desired thickness and the voltage to be applied is approximately 1 nm/Volt; in this embodiment the voltage is chosen to be approximately 25 V.

The next operation consists in dividing the aluminum layer 5 into a first conductor pattern 5a and a plate 5b for a MOM capacitor. For this purpose, one or more windows 7 are provided in the layer 6 and in said layer 5, after which the assembly is covered with a second layer 8 of insulating material (FIG. 2).

Subsequently, in this layer 8 a given number of windows are provided, a certain number of which 9 are also provided in the insulating layer 6, whereas in other windows 10 said layer 6 remains present. The whole surface is covered with a second metal layer of, for example, aluminum which is subjected to a photo-etching process in order to form the second conductor pattern 11 which comprises the second plate 12 of the capacitor.

The said capacitor, whose plates 5b, 12 are obtained simultaneously with the conductor patterns 5a and 11, is composed of two plates 5b and 12 separated by a dielectric constituted by the dense aluminum oxide layer 6.

As shown in FIG. 3, a part of the conductor pattern 11 comes into contact with a part of the conductor pattern 5a through the aperture 9 (a so-called "via").

What is claimed is:

1. A method of manufacturing a semiconductor device having a semiconductor body which at a surface is provided with circuit elements and a multilayer wiring structure, in which the surface of the semiconductor body is coated with a first layer of insulating material on which there is formed from a metal layer deposited on the insulating material a first conductor pattern which contacts the semiconductor body at the area of contact holes in the first layer of insulating material and comprises at least one plate of a capacitor, after which a second conductor pattern is applied which comprises a second plate of the capacitor and is separated therefrom by a dielectric obtained by anodic oxidation from the metal layer deposited on the first layer of insulating material, characterized in that, after the first layer of insulating material has been provided with contact windows, the metal layer is deposited on the whole surface of the semiconductor body and is converted over a pair of its thickness by anodic oxidation into a second insulating layer of metal oxide, after which the double layer of metal and metal oxide is patterned photolithographically and the assembly is then coated with a third layer of insulating material, which at the area of the second plate of the capacitor and of connections between the two conductor patterns is provided with apertures, the metal oxide formed further being removed at the area of the connections, after which a layer of conductive material is applied, from which the second conductor pattern is formed photolithographically, which at the area of the connections contacts the first conductor pattern and which comprises the second plate of the capacitor, which is separated from the first plate by a part of the layer of metal oxide which is grown by anodic oxidation and serves as a dielectric.

2. A method as claimed in claim 1, characterized in that the two conductor patterns are formed from aluminum and the dielectric consists of aluminum oxide.

3. A semiconductor device manufactured by means of the method claimed in claim 1.

4. A semiconductor device manufactured by means of the method claimed in claim 2.

* * * * *